(12) United States Patent
Im et al.

(10) Patent No.: US 12,041,835 B2
(45) Date of Patent: Jul. 16, 2024

(54) DISPLAY DEVICE AND METHOD FOR MANUFACTURING SAME

(71) Applicant: SAMSUNG ELECTRONICS CO., LTD., Suwon-si (KR)

(72) Inventors: Sangkyun Im, Suwon-si (KR); Joowhan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/079,463

(22) Filed: Dec. 12, 2022

(65) Prior Publication Data

US 2023/0112836 A1 Apr. 13, 2023

Related U.S. Application Data

(63) Continuation of application No. PCT/KR2021/003935, filed on Mar. 30, 2021.

(30) Foreign Application Priority Data

Jun. 11, 2020 (KR) .................. 10-2020-0071085

(51) Int. Cl.
*H10K 59/35* (2023.01)
*G06F 3/14* (2006.01)
*G09G 3/32* (2016.01)

(52) U.S. Cl.
CPC ......... *H10K 59/353* (2023.02); *G06F 3/1446* (2013.01); *G09G 3/32* (2013.01);
(Continued)

(58) Field of Classification Search
CPC .. G06F 3/1446; G09G 3/32; G09G 2300/026; G09G 2300/0443; H01K 59/353
See application file for complete search history.

(56) References Cited

U.S. PATENT DOCUMENTS 9,122,094 B2 9/2015 Fujiwara et al.
9,305,980 B2 4/2016 Kim
(Continued)

FOREIGN PATENT DOCUMENTS

CN 208507679 U 2/2019
CN 110379836 A 10/2019
(Continued)

OTHER PUBLICATIONS

International Search Report (PCT/ISA/210) dated Jul. 16, 2021 issued by the International Searching Authority in International Application No. PCT/KR2021/003935.
(Continued)

*Primary Examiner* — Matthew A Eason
*Assistant Examiner* — Sujit Shah
(74) *Attorney, Agent, or Firm* — Sughrue Mion, PLLC

(57) ABSTRACT

A display device includes a plurality of pixels. Each of the plurality of pixels includes a first, a second, and a third sub pixel that are disposed in a vertical direction. A first pixel of the plurality of pixels includes: a first sub pixel of the first pixel, a second sub pixel of the first pixel, which is disposed to be spaced apart from the first sub pixel of the first pixel by a first distance, and a third sub pixel of the first pixel, which is disposed to be spaced apart from the second sub pixel of the first pixel by the first distance. A second pixel of the plurality of pixels also includes a first sub pixel and a second sub pixel, which are separated apart by a second distance that is different from the first distance.

13 Claims, 12 Drawing Sheets

(52) U.S. Cl.
CPC ................ *G09G 2300/026* (2013.01); *G09G 2300/0443* (2013.01)

(56) References Cited

U.S. PATENT DOCUMENTS

| | | | |
|---|---|---|---|
| 9,336,703 | B2 | 5/2016 | Kim |
| 9,570,425 | B2 | 2/2017 | Do |
| 11,150,856 | B2 | 10/2021 | Seo et al. |
| 2014/0111115 | A1 | 4/2014 | Bai et al. |
| 2018/0308907 | A1 | 10/2018 | Jin et al. |
| 2019/0043940 | A1* | 2/2019 | Lee .................. H01L 27/156 |
| 2019/0096983 | A1* | 3/2019 | Liu .................. H10K 59/351 |
| 2019/0165035 | A1* | 5/2019 | Fu .................... H01L 25/167 |
| 2019/0251917 | A1* | 8/2019 | Hao .................. G09G 3/3648 |
| 2019/0310724 | A1 | 10/2019 | Yeke Yazdandoost et al. |
| 2019/0373166 | A1 | 12/2019 | Jia |
| 2020/0066809 | A1 | 2/2020 | Liu |
| 2020/0193943 | A1* | 6/2020 | Iversen ................ G06F 3/1446 |
| 2021/0013275 | A1 | 1/2021 | Kim et al. |
| 2021/0376011 | A1 | 12/2021 | Liu et al. |

FOREIGN PATENT DOCUMENTS

| | | |
|---|---|---|
| CN | 107886850 B | 12/2019 |
| JP | 2007-155780 A | 6/2007 |
| JP | 2017-58671 A | 3/2017 |
| KR | 10-2014-0104844 A | 8/2014 |
| KR | 10-1436123 B1 | 11/2014 |
| KR | 10-2015-0012542 A | 2/2015 |
| KR | 10-2020-0003596 A | 1/2020 |

OTHER PUBLICATIONS

Written Opinion (PCT/ISA/237) dated Jul. 16, 2021 issued by the International Searching Authority in PCT/KR2021/003935.

* cited by examiner

| 110-1 | 110-2 | 110-3 | 110-4 |
| 110-5 | 110-6 | 110-7 | 110-8 |
| 110-9 | 110-10 | 110-11 | 110-12 |

DISPLAY DEVICE AND METHOD FOR MANUFACTURING SAME

This application is a by-pass continuation application of International Application No. PCT/KR2021/003935, filed on Mar. 30, 2021, which based on and claims priority to Korean Patent Application No. 10-2020-0071085, filed on Jun. 11, 2020, in the Korean Intellectual Property Office, the disclosures of which are incorporated by reference herein in their entireties.

BACKGROUND

1. Field

The disclosure relates to a display device and a method for manufacturing the same, and more particularly, to a display device including a display module and a method for manufacturing the same.

2. Description of Related Art

Recently, various electronic devices are under development with developments in electronic technology. In particular, a display device providing a large format screen by connecting a plurality of display modules is being developed. Display devices, as described above, may provide a user with visual satisfaction by displaying an image through the large format screen.

However, as display devices becoming more high resolution, intervals between modules are becoming more densified, and an integration density of sub pixel Light Emitting Diode (LED) devices are increasing. Based on the above, a deep-submicron process is required in a module production, and a problem of a production yield of modules decreasing may occur. There is a need for a manufacturing method of a module, which enhances production yield as well as minimizes distortion of an image.

Aspects of the disclosure are to address at least the above-mentioned problems and/or disadvantages, and one object of the disclosure may provide a display device and a method for manufacturing the same to enhance production yield of a display module by variously changing a distance between sub pixels (forming a pixel included in the display module).

SUMMARY

According to an aspect of an embodiment of the present disclosure, a display device includes: a plurality of display modules and a processor configured to control the plurality of display modules to display an image. Each of the plurality of display modules includes a plurality of pixels. Each of the plurality of pixels includes a first sub pixel, a second sub pixel, and a third sub pixel that are disposed in a vertical direction. A first pixel of the plurality of pixels includes: a first sub pixel of the first pixel, a second sub pixel of the first pixel, which is disposed to be spaced apart from the first sub pixel of the first pixel by a first distance, and a third sub pixel of the first pixel, which is disposed to be spaced apart from the second sub pixel of the first pixel by the first distance. A second pixel of the plurality of pixels includes: a first sub pixel of the second pixel, a second sub pixel of the second pixel, which is disposed to be spaced apart from the first sub pixel by a second distance that is different from the first distance, and a third sub pixel of the second pixel, which is disposed to be spaced apart from the second sub pixel of the second pixel by a third distance.

According to another aspect of an embodiment of the present disclosure, a display device includes a plurality of pixels. Each of the plurality of pixels includes a first sub pixel, a second sub pixel, and a third sub pixel that are disposed in a vertical direction. A first pixel of the plurality of pixels includes: a first sub pixel of the first pixel, a second sub pixel of the first pixel, which is disposed to be spaced apart from the first sub pixel of the first pixel by a first distance, and a third sub pixel of the first pixel, which is disposed to be spaced apart from the second sub pixel by the first distance. A second pixel of the plurality of pixels includes: a first sub pixel of the second pixel, a second sub pixel of the second pixel, which is disposed to be spaced apart from the first sub pixel by a second distance that is different from the first distance, and a third sub pixel of the second pixel, which is disposed to be spaced apart from the second sub pixel by a third distance.

According to another aspect of an embodiment of the present disclosure, a method for manufacturing a display device, includes: providing a substrate; and forming a pixel by disposing a first sub pixel, a second sub pixel, and a third sub pixel in a vertical direction on the substrate. The forming the pixel includes, forming a first pixel that includes, a first sub pixel of the first pixel, a second sub pixel of the first pixel, which is disposed to be spaced apart from the first sub pixel by a first distance, and a third sub pixel of the first pixel, which is disposed spaced apart from the second sub pixel by the first distance. The forming the pixel also includes, forming a second pixel that includes, a first sub pixel of the second pixel, a second sub pixel of the second pixel, which is disposed to be spaced apart from the first sub pixel by a second distance that is different from the first distance, and a third sub pixel of the second pixel, which is disposed spaced apart from the second sub pixel by a third distance.

According to one or more embodiments of the disclosure as described above, an interval between sub pixels which form a pixel that is included in the display device may be variously modified to enhance a production yield of display modules.

The interval between sub pixels which form a specific pixel from among a plurality of pixels included in the display device may be maintained uniformly and a problem a distortion occurring or a border line occurring when providing an image may be minimized.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2 is a diagram illustrating a display module according to an embodiment of the disclosure;

DETAILED DESCRIPTION

Figure 1:
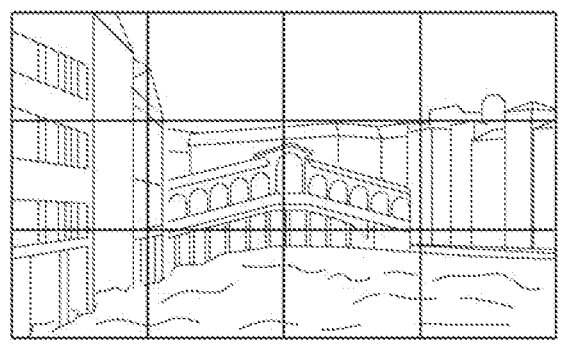
FIG. 1 is a diagram illustrating a display device according to an embodiment of the disclosure.

Terms used herein will be briefly described, and the disclosure will be described in greater detail below. The terms used in describing the various embodiments of the disclosure are general terms selected that are currently widely used considering their function herein. However, the terms may change depending on intention, legal or technical interpretation, emergence of new technologies, and the like of those skilled in the related art. Further, in certain cases, there may be terms arbitrarily selected, and in this case, the meaning of the term will be disclosed in greater detail in the corresponding description. Accordingly, the terms used herein are not to be understood simply as its designation but based on the meaning of the term and the overall context of the disclosure.

Various modifications may be made to the embodiments of the disclosure, and there may be various types of embodiments. Accordingly, specific embodiments will be illustrated in drawings and described in detail in the detailed description. However, it should be noted that the various embodiments are not for limiting the scope of the disclosure to a specific embodiment, and should be interpreted to include all modifications, equivalents or alternatives of the embodiments included in the ideas and the technical scopes disclosed herein. In case it is determined that in describing the embodiments, detailed description of related known technologies may unnecessarily confuse the gist of the disclosure, the detailed description will be omitted.

The terms such as "first" and "second" may be used to describe various elements, but the elements may not be limit by the terms. The terms may be used only for the purpose of distinguishing one element from another element.

A singular expression may include a plural expression, unless clearly indicated otherwise in the context. It is to be understood that the terms such as "include" or "form" are used herein to designate a presence of a characteristic, number, step, operation, element, component, or a combination thereof, and not to preclude a presence or a possibility of adding one or more of other characteristics, numbers, steps, operations, elements, components or a combination thereof.

In the disclosure, terms such as "module" or "part" may be used to perform at least one function or operation, and may be implemented as hardware or software, or a combination of hardware and software. Further, a plurality of "modules" or a plurality of "parts" except for when the "modules" or "parts" need to be implemented to a specific hardware, may be integrated to at least one module to be implemented as at least one processor.

Embodiments of the disclosure have been described in detail below with reference to the accompanying drawings to aid in the understanding of those of ordinary skill in the art. However, the disclosure may be implemented in various different forms and it should be noted that the disclosure is not limited to the various embodiments described herein. Further, in the drawings, parts not relevant to the description may be omitted to clearly describe the disclosure, and like reference numerals may be used to indicate like elements throughout the whole disclosure.

FIG. 1 is a diagram illustrating a display device according to an embodiment of the disclosure. The display device 100, according to an embodiment, may include one or a plurality of display modules. For example, referring to FIG. 1, the display device 100 according to an embodiment may include a plurality of display modules. Here, each display module may be physically connected and form one display.

FIG. 2 is a diagram illustrating a display module according to an embodiment of the disclosure. Referring to FIG. 2, each of the plurality of display modules 110-1 to 110-12 according to an embodiment may be implemented as a LED display module which includes an inorganic light emitting diode (LED). Each of the plurality of display modules 110-1 to 110-12, according to an embodiment of the disclosure, may be implemented as an LED display module which includes a plurality of pixels that include a red (R) sub pixel, a green (G) sub pixel, and a blue (B) sub pixel.

Referring to FIG. 2, the display device 100, according to an embodiment, may be implemented to a form in which the plurality of display modules 110-1 to 110-12 is coupled or connected in a 4×3 array. The LED display module of the 4×3 array is merely one embodiment, and a form and number of an array of the LED display module may be variously modified. For example, a number of pixels included in a display module 110 may be variously modified according to an object of a manufacturer, a manufacturing process, and the like, and the form and number of the array of the display module 110 that form the display device 100 may be variously modified according to the object of a manufacturer, the manufacturing process, and the like.

In an example, the display device 100 may be implemented as a large scale display device in which the plurality of display modules 110 is coupled or connected, for example, a digital signage, a wall display, and a video wall that are installed at public locations or industrial spaces.

The display device 100 including the plurality of display modules 110-1 to 110-12 may be collectively referred to as a 'cabinet' or a 'sub-screen.' The number of display modules 110 forming the cabinet or the sub-screen may not be fixed, and may be variously modified.

Figure 3:
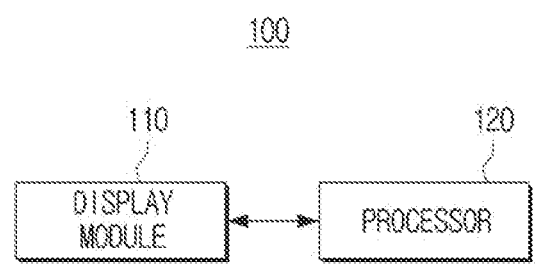
FIG. 3 is a block diagram illustrating a display device according to an embodiment of the disclosure.

FIG. 3 is a block diagram illustrating a display device according to an embodiment of the disclosure. Referring to FIG. 3, the display device 100 according to an embodiment may include the display module 110 and a processor 120.

The display device 100 may be implemented as a television (TV), but is not limited thereto. For example, the display device 100 may be applicable without being limited as long as it is a device that has a display function such as, for example, and without limitation, a video wall, a large format display (LFD), a digital signage, a digital information display (DID), a projector display, and the like. In addition, the display device 100 may be implemented as a display of various forms such as, for example, and without limitation, a liquid crystal display (LCD), an organic light emitting diode (OLED), a liquid crystal on silicon (LCoS), a digital light processing (DLP), a quantum dot (QD) display panel, a quantum dot light emitting diodes (QLED), a micro light-emitting diodes (μLED), a mini LED, or the like. The display device 100 may be implemented as a touch screen coupled or connected with a touch sensor, a flexible display, a rollable display, a three-dimensional display (3D display), a display in which the plurality of display modules is physically connected, and the like.

The display device 100, according to an embodiment, may be one from among a plurality of display devices that form a modular display device, and may include the display module 110 in plurality.

The display module 110 may display various images. Here, an image may be a concept that includes a still image and a moving image, and the display module 110 may display various images such as, for example, and without limitation, broadcast content, multi-media content, and the like. In addition, the display module 110 may display a user interface (UI) and an icon.

Specifically, the display module 110 may include an integrated circuit (IC) chip, and the IC chip may display an image based on an image signal received from the processor 120. In an example, the IC chip may generate an LED driving signal based on an image signal received from the processor 120, and display, based on the LED driving signal, an image by controlling light emission of the plurality of pixels included in the display module 110. According to an embodiment, the IC chip may be an LED driver IC chip.

The display module 110, according to an embodiment, may be implemented as a display which includes a self-emissive device or a display which includes a non-emissive device and a backlight. For example, the display module may be implemented as a display of various forms such as, for example, and without limitation, a liquid crystal display (LCD), an organic light emitting diode (OLED) display, light emitting diodes (LEDs), a micro LED, a mini LED, a plasma display panel (PDP), a quantum dot (QD) display, a quantum dot light-emitting diodes (QLED), and the like. In the display module 110, a driving circuit which may be implemented in a form of an a-si thin film transistor (TFT), a low temperature poly silicon (LTPS) TFT, an organic TFT (OTFT), or the like, a backlight unit, and the like may be included together. The display module 110 may be implemented as a touch screen coupled or connected with a touch sensor, a flexible display, a rollable display, a three-dimensional display (3D display), a display in which the plurality of display modules 110-1 to 110-12 is physically connected, and the like.

The processor 120 may control the overall operation of the display device 100. Here, the processor 120 may be formed of one or a plurality of processors. Specifically, the processor 120 may perform, by executing at least one instruction stored in a memory, an operation of the display device 100 according to the various embodiments.

The processor 120, according to an embodiment, may be implemented as a digital signal processor (DSP) which processes a digital image signal, a microprocessor, a graphics processing unit (GPU), an artificial intelligence (AI) processor, a neural processing unit (NPU), or a time controller (TCON). However, the embodiment is not limited thereto, and may include one or more from among a central processing unit (CPU), a micro controller unit (MCU), a micro processing unit (MPU), a controller, an application processor (AP), a communication processor (CP), or an ARM processor, or may be defined by the corresponding term. In addition, the processor 120 may be implemented as a system on chip (SoC) or a large scale integration (LSI) in which a processing algorithm is embedded, and may be implemented in the form of an application specific integrated circuit (ASIC) and a field programmable gate array (FPGA).

The processor 120 may control hardware or software elements connected to the processor 120 by driving an operating system or an application, and perform various data processing and calculations. In addition, the processor 120 may process commands or data received from at least one from among other elements by loading in a memory, and store various data in a non-volatile memory.

The display device 100 and the display module 110, according to an embodiment, will be described below with reference to FIG. 4 and FIG. 5.

Figure 4:
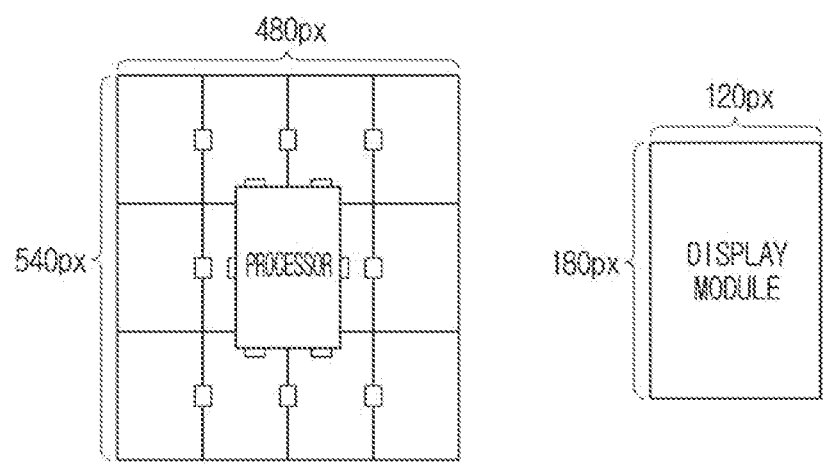
FIG. 4 is a diagram illustrating a display device which includes a plurality of display modules in a 4×3 array according to an embodiment of the disclosure.

FIG. 4 is a diagram illustrating a display device which includes a plurality of display modules in a 4×3 array, according to an embodiment of the disclosure. The display device 100, according to an embodiment, may include the plurality of display modules 110-1 to 110-12. In an example, the plurality of display modules 110-1 to 110-12 may be arrayed in a matrix format (e.g., M×N, here M and N may be natural numbers). Specifically, a matrix may not only be a format in a square array (e.g., M=N, here M and N are natural numbers, 16×16 array, 24×24 array, etc.), but also be in an array format different from the above (e.g., M≠N, here M and N are natural numbers).

The LED of the LED display module, according to an embodiment, may be implemented as a micro LED. Here, the micro LED may be an LED of about 5-100 micrometers in size, and may mean an ultra-small light-emitting device that emits light on its own without a color filter.

The LED display module as described above is merely one embodiment, and the display module may be implemented as a liquid crystal panel (LCD), an organic LED (OLED), an active-matrix OLED (AMOLED) panel, a plasma display panel (PDP), and the like, which are flat panel type display panels. For convenience of description, it will be described below assuming that the display module, according to an embodiment of the disclosure, is the LED display module.

Referring to FIG. 4, the display device 100, according to an embodiment, may include the plurality of display modules 110-1 to 110-12 which are arrayed in the 4×3 format. However, this is merely one embodiment and is not limited thereto.

The display module 110, according to an embodiment, may include a plurality of pixels arrayed in the matrix format. Referring to FIG. 4, although it has been described assuming that the display module 110 includes 21,600 pixels arrayed in a 120×180 format for convenience of description, this is merely one embodiment and is not limited thereto. For example, the display module 110 may include 43,200 pixels arrayed in a 240×180 format. In addition, a size and ratio of the display module 110 may be variously modified according to a number of pixels included in the display module 110 and a distance between the pixels (e.g., a pixel pitch).

Figure 5:
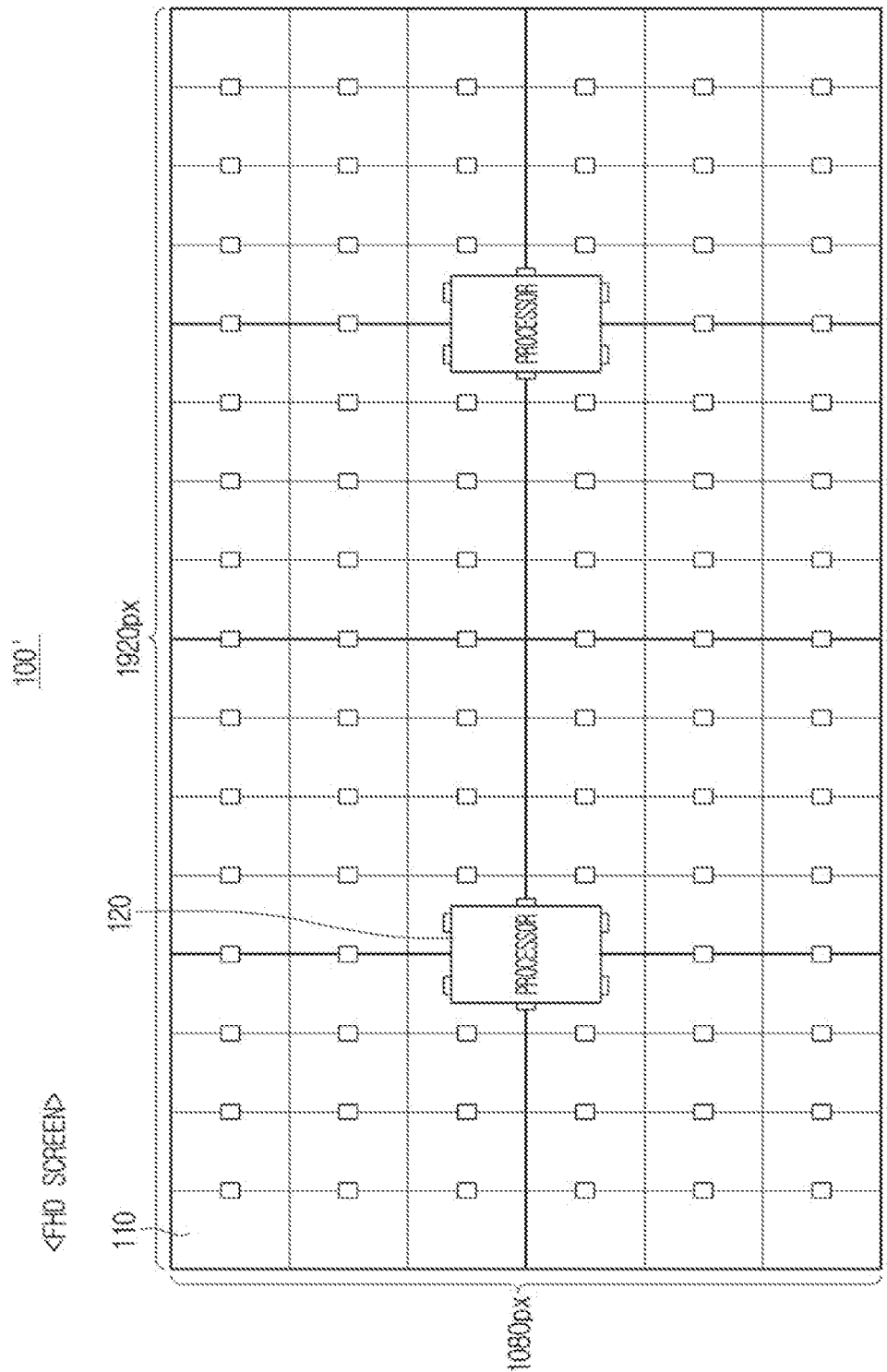
FIG. 5 is a diagram illustrating a display device according to an embodiment of the disclosure.

FIG. 5 is a diagram illustrating a display device according to an embodiment of the disclosure. Referring to FIG. 5, a modular display device 100' according to an embodiment may be implemented as a modular display device 100' in which the plurality of display modules 110 or the plurality of cabinets is coupled or connected.

In FIG. 5, twelve display modules 110 have been designated as a sub cabinet (for convenience of description), and although the modular display device 100' including a full high definition (FHD) screen implemented with four sub cabinets has been assumed and shown, this is merely one example and is not limited thereto. For example, the display device 100 may include the display module 110, the cabinet or the sub-screen, and the like, in plurality and may be implemented as the modular display device 100' having various resolutions such as 4K (e.g., 3840×2160), and 8K. An array format of the plurality of pixels included in the display module 110 will be described below with reference to FIG. 6 to FIG. 11.

Figure 6:
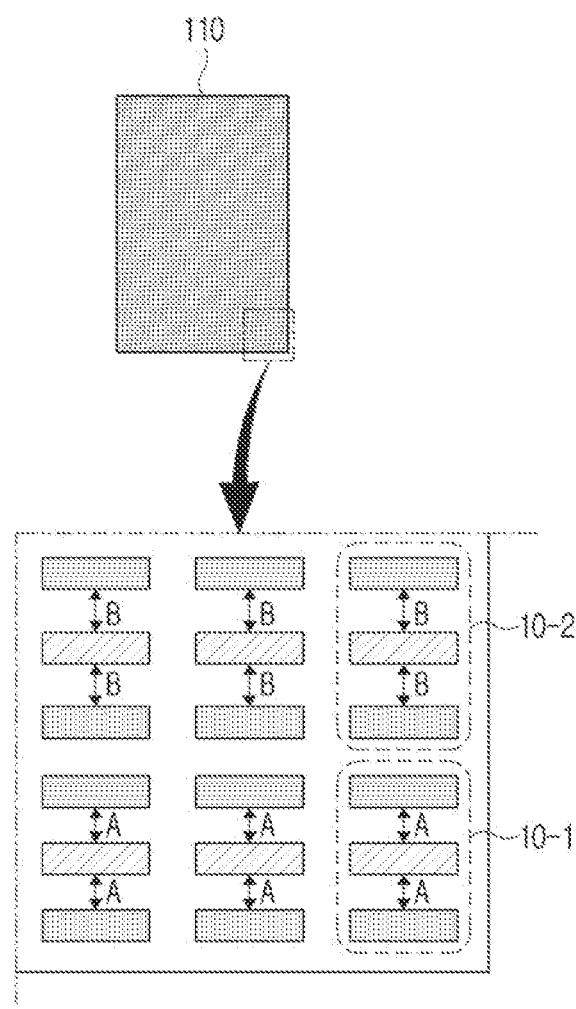
FIG. 6 is a diagram illustrating a pixel which includes a plurality of sub pixels according to an embodiment of the disclosure.

FIG. 6 is a diagram illustrating a pixel that includes a plurality of sub pixels, according to an embodiment of the disclosure. Referring to FIG. 6, the display module 110, according to an embodiment, may include a plurality of pixels 10. Each of the plurality of pixels 10 may include a first sub pixel, a second sub pixel, and a third sub pixel. For example, the first sub pixel may be implemented as the red (R) sub pixel, the second sub pixel may be implemented as the green (G) sub pixel, and the third sub pixel may be implemented as the blue (B) sub pixel, but this is one example and is not limited thereto.

The first to third sub pixels included in one pixel, according to an embodiment, may be disposed in a line in a vertical direction. This is one example, and the first to third sub pixels included in the one pixel may also be disposed in a line in a horizontal direction.

The first to third sub pixels included in each of the plurality of sub pixels included in the display module 110 may be disposed spaced apart by a same interval (e.g., by a first interval A), but as shown in FIG. 6, the distance which is disposed spaced apart between the first to third sub pixels for each pixel may be different.

Referring to FIG. 6, a first pixel 10-1 from among the plurality of pixels included in the display module 110 may include the first to third sub pixels. Here, the second sub pixel included in the first pixel 10-1 may be disposed spaced apart from the first sub pixel by a first distance A. In addition, the third sub pixel included in the first pixel 10-1 may be disposed spaced apart from the second sub pixel by the first distance A.

A second pixel 10-2 from among the plurality of pixels included in the display module 110 according to an embodiment may include the first sub pixel, the second sub pixel which is disposed spaced apart by a second distance B with the first sub pixel, and the third sub pixel which is disposed spaced apart by the second distance B with the second sub pixel. Accordingly, the distance which is disposed spaced apart between the first to third sub pixels included in the first pixel 10-1 may be the first distance A, and the distance which is disposed spaced apart between the first to third sub pixels included in the second pixel 10-2 may be the second distance B. Here, the first distance A and the second distance B may be a same distance, or may be different distances.

AA third pixel from among the plurality of pixels included in the display module 110 may include the first sub pixel, the second sub pixel which is disposed spaced apart by a third distance with the first sub pixel, and the third sub pixel which is disposed spaced apart by the third distance with the second sub pixel. Here, the third distance may be a different distance from the first and second distances.

Figure 7:
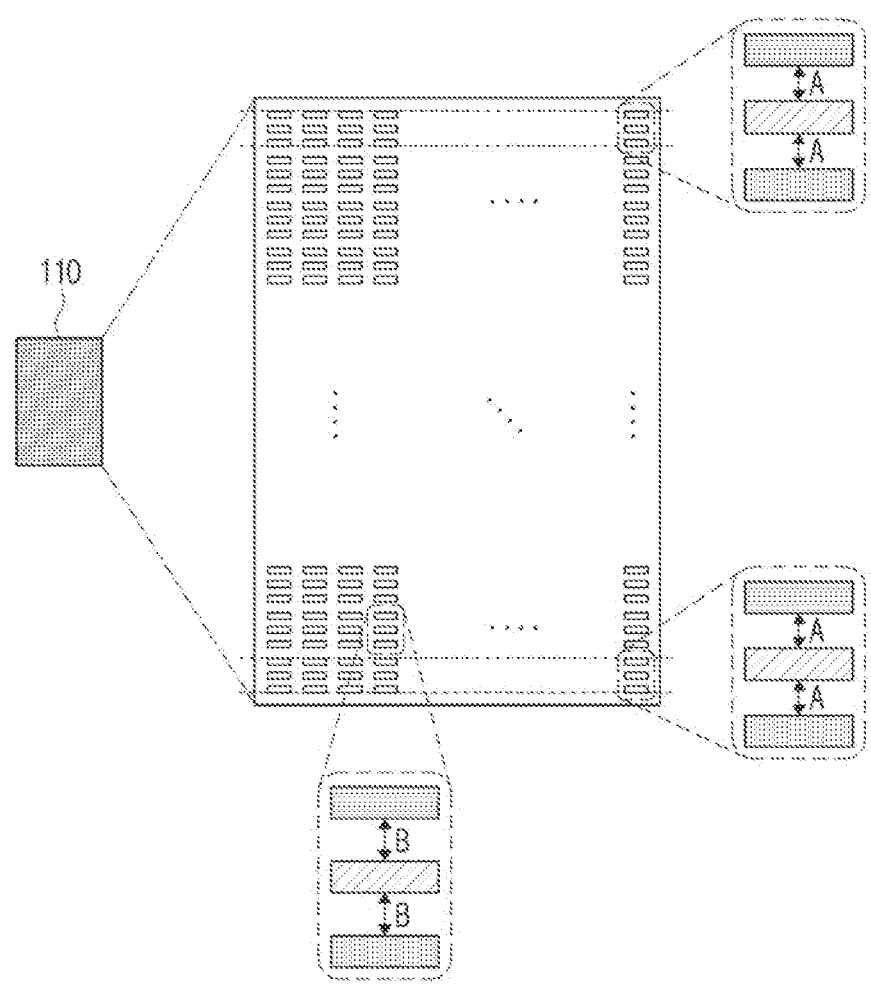
FIG. 7 is a diagram illustrating a pixel that includes a plurality of sub pixels according to an embodiment of the disclosure.

FIG. 7 is a diagram illustrating a pixel that includes a plurality of sub pixels according to an embodiment of the disclosure.

Referring to FIG. 7, the first pixel 10-1 which includes the first to third sub pixels that are disposed spaced apart by the first distance A between the first to third sub pixels may correspond to pixels positioned at both edge areas facing each other within the display module 110.

For example, based on the display module 110 including the plurality of pixels which are disposed in a 120×180 matrix format, each of the pixels which are positioned at an upper edge area and a lower edge area of the display module 110 may include the first to third sub pixels which are disposed spaced apart by the first distance A. Referring to FIG. 7, the first to third sub pixels included in each of a total of 240 pixels, that is, 120 pixels positioned at the upper edge area and 120 pixels positioned at the lower edge area, may be disposed spaced apart by the first distance A. For example, the first sub pixel may be disposed spaced apart from the second sub pixel by the first distance A, and the third sub pixel may be disposed spaced apart from the second sub pixel by the first distance A. However, this is one example, and the embodiment is not limited thereto.

For example, the display module 110 may include the plurality of pixels which is disposed in a M×N format, and the first sub pixel and the third sub pixel included in each of a total of 2M pixels, that is, M pixels positioned at the upper edge area and M pixels positioned at the lower edge area in both edge areas within the display module 110, may be disposed spaced apart by the first distance A based on the second sub pixel.

In another example, the display module 110 may include the plurality of pixels which is disposed in the M×N format, and the first sub pixel and the third sub pixel included in each of a total of 2N pixels, that is, N pixels positioned at a left edge area and N pixels positioned at a right edge area in both edge areas within the display module 110, may be disposed spaced apart by the first distance A based on the second sub pixel.

In another example, the display module 110 may include the plurality of pixels which is disposed in the M×N format, and the first sub pixel and the third sub pixel included in each of a total of 2M+2N−4 pixels positioned at the edge area (or, a border area, an outer area) within the display module 110 may be disposed spaced apart by the first distance A based on the second sub pixel.

Based on the pixels positioned at the both edge areas within the display module 110 corresponding to the first pixel 10-1, the pixels positioned at a remaining area excluding the both edge areas may correspond to the second pixel 10-2. Referring to FIG. 7, the first sub pixel and the third sub pixel included in each of the pixels positioned at the both edge areas within the display module 110 may be disposed spaced apart by the first distance A based on the second sub pixel, and the first sub pixel and the third sub pixel included in each of the pixels positioned at the remaining area excluding the both edge areas may be disposed spaced apart by the second distance B based on the second sub pixel.

In FIG. 7, all pixels positioned at the remaining area excluding (outside of) the both edge areas are shown assuming that the pixels include the second sub pixel, and the first and third sub pixels which are disposed spaced apart by the second distance B based on the second sub pixel for convenience of description, but the embodiment is not limited thereto.

For example, the pixels positioned at the both edge areas within the display module 110 may include the first to third sub pixels which are disposed spaced apart by the first distance A, a portion from among the pixels positioned at the remaining area excluding the both edge areas may include the first to third sub pixels which are disposed spaced apart by the second distance B, and the pixels positioned at the remaining area excluding the both edge areas and a portion of the areas may include the first to third sub pixels which are disposed spaced apart by the third distance. Here, the first distance A may be a distance which is relatively shorter than the second distance B and the third distance.

As a size of the sub pixel device, that is, the LED device, becomes microminiaturizing, a size of a substrate that form the display module 110, and a distance between the LED pads are also becoming smaller. As the size of the substrate becomes smaller, and the distance between the LED pads becomes narrower, a degree of accumulation and density of the sub pixel devices may increase. In this case, a problem of a production yield decreasing may occur due to difficulty in the deep-submicron process in the production process of the display module 110.

Based on a portion of the pixels from among the plurality of pixels included in the display module 110 fixing the distance between the sub pixels, and the remaining pixels fluidly adjusting and generating the distance between the sub pixels, there may be the effect of minimizing resolution deterioration when outputting an image and image distortion occurrence, and increasing the production yield.

Each of the pixels positioned at the both edge areas within the display module 110 according to an embodiment may include the first to third sub pixels which are disposed spaced apart by the first distance A in which the intervals between the sub pixels are relatively narrow, and each of the pixels positioned at the remaining area may include the first to third sub pixels which are disposed spaced apart by the second distance B in which the intervals between the sub pixels are relatively high (wide).

Figure 8:
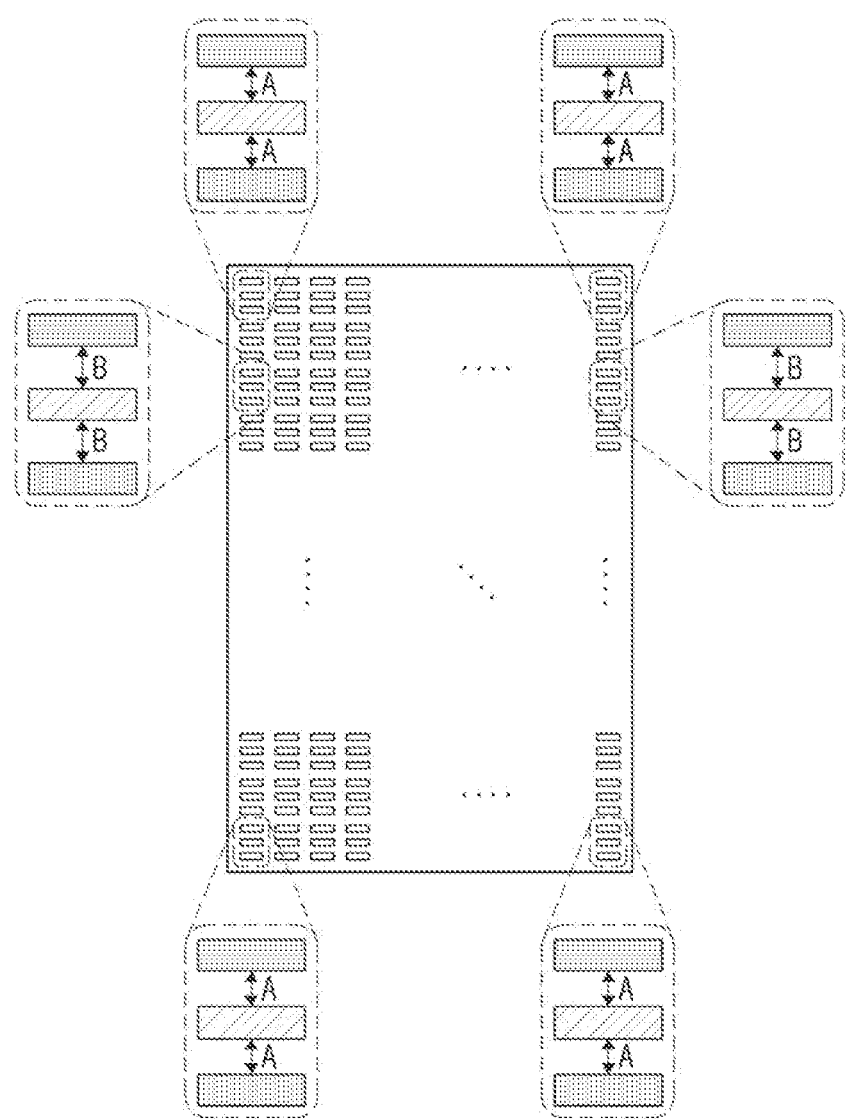
FIG. 8 is a diagram illustrating a pixel that includes a plurality of sub pixels according to another embodiment of the disclosure.

FIG. 8 is a diagram illustrating a pixel that includes a plurality of sub pixels, according to another embodiment of the disclosure. Referring to FIG. 8, the display module 110, according to another embodiment, may include the plurality of pixels 10 arrayed in the matrix format. At least one pixel from among the plurality of pixels may correspond to the pixels positioned at four vertex areas within the display module 110. Here, the first to third sub pixels included in each of the pixels positioned at the four vertex areas may be disposed spaced apart by the first distance A.

The remaining pixels excluding the pixels positioned at the four vertex areas from among the plurality of pixels included in the display module 110 may include the first to third sub pixels which are disposed spaced apart by the second distance B. The above is one example and the embodiment is not limited thereto.

For example, a total of 6 pixels, that is, the pixels positioned at the four vertex areas, the pixel positioned at a center of the upper edge area, and the pixel positioned at a center of the lower edge area from among the plurality of pixels included in the display module 110, may include the first to third sub pixels which are disposed spaced apart by the first distance A. The remaining pixels from among the plurality of pixels included in the display module 110 may include the first to third sub pixels which are disposed spaced apart by the second distance B.

As shown in FIG. 7 and FIG. 8, because a pixel positioned at an area at which the display module 110 and other display module 110' which is disposed adjacent to the display module 110 are engaged, for example, the both edge areas, the four vertex areas, and the like within the display module 110, includes the first to third sub pixels which are disposed spaced part by a same interval, a problem of a user recognizing a seam, which is a border line between the display module 110 and the other display module 110' when displaying an image, may not occur.

For example, because a pixel positioned at the both edge areas within the display module 110 may include the first to third sub pixels which are disposed spaced apart by the first distance A, and a pixel positioned at both edge areas within the other display module 110' that is positioned adjacent to the display module 110 includes the first to third sub pixels which are disposed spaced apart by the first distance A, the occurrence of the seam, which is the border line between the display module 110 and the other display module 110' may be minimized.

The embodiment shown in FIG. 7 and FIG. 8 is an example, and is not limited thereto. For example, the plurality of pixels positioned at an outer area within the display module 110 may be formed as the first pixel 10-1 and the second pixel 10-2 are alternately disposed. Here, the first pixel 10-1 may be a pixel in which the interval between the first to third sub pixels is the first distance A, and the second pixel 10-2 may be a pixel in which the interval between the first to third sub pixels is the second distance B. Here, the first distance A may be a distance relatively shorter than the second distance B.

Figure 9:
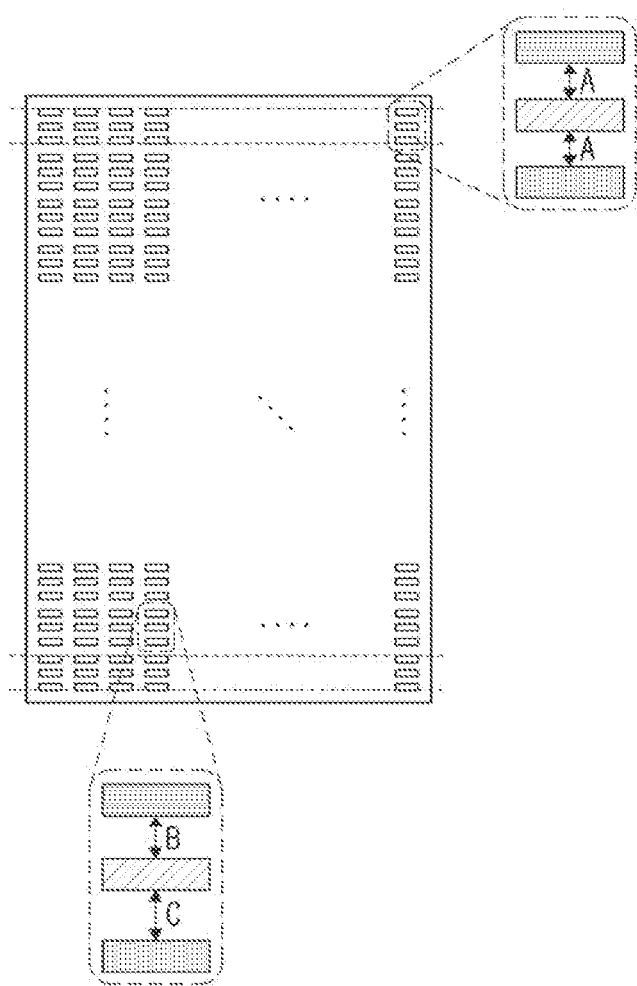
FIG. 9 is a diagram illustrating a pixel that includes a plurality of sub pixels according to another embodiment of the disclosure.

FIG. 9 is a diagram illustrating a pixel that includes a plurality of sub pixels according to another embodiment of the disclosure. Referring to FIG. 9, the pixel according to an embodiment may include the first sub pixel, the second sub pixel which is disposed spaced apart from the first sub pixel by the second distance B, and the third sub pixel which is disposed spaced apart from the second sub pixel by a third distance C.

For example, the first pixel 10-1 positioned at both edge areas within the display module 110 may include the first and third sub pixels which are disposed spaced apart from the second sub pixel by the same interval (e.g., first distance A). Here, the second pixel 10-2 positioned at the remaining area excluding the both edge areas within the display module 110 may include the first sub pixel and the third sub pixel which are each disposed spaced apart from the second sub pixel by different intervals (e.g., second distance B and third distance C). For example, the first sub pixel included in the second pixel 10-2 may be disposed spaced apart from the second sub pixel by the second distance B, and the third sub pixel may be disposed spaced apart from the second sub pixel by the third distance C.

Here, the second distance B and the third distance C may be the same distance, and may be different distances. A portion of the pixels from among the plurality of pixels included in the display module 110 may include the first to third sub pixels which are disposed spaced apart by a fourth distance which is different from the first to third distances.

Figure 10:
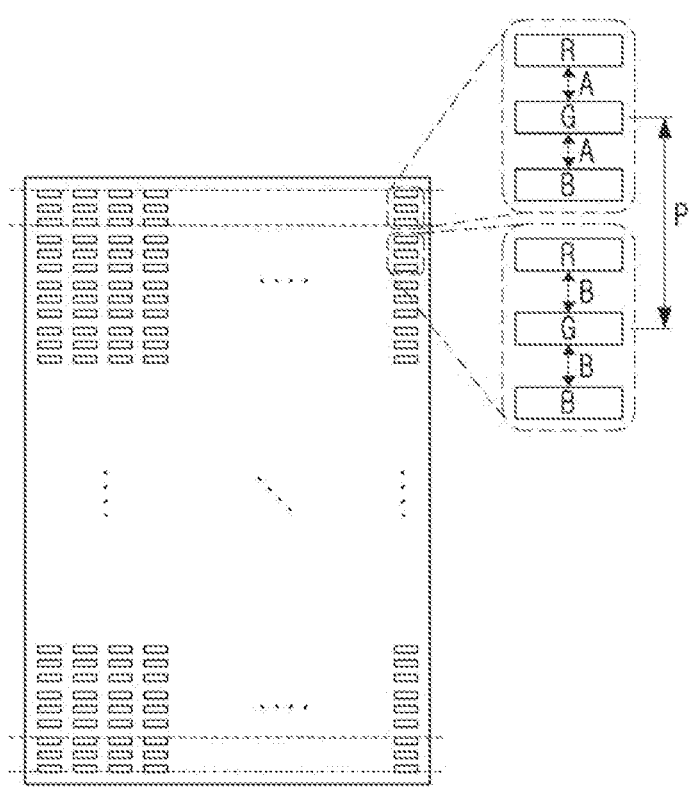
FIG. 10 is a diagram illustrating a pixel pitch according to an embodiment of the disclosure.

FIG. 10 is a diagram illustrating a pixel pitch according to an embodiment of the disclosure. Referring to FIG. 10, the interval between the second sub pixels included in each of the plurality of pixels according to an embodiment may be the same.

For example, each of the plurality of pixels may include the first to third sub pixels which are disposed in a line in the vertical direction. As shown in FIG. 10, the sub pixels may be disposed in a line in an order of the first sub pixel, the second sub pixel, and the third sub pixel. Here, the distance of the first sub pixel from the second sub pixel, and the distance of the third sub pixel from the second sub pixel may be different for each pixel. For example, in the first pixel 10-1, the distance of the first sub pixel from the second sub pixel may be the first distance A, and in the second pixel 10-2, the distance of the first sub pixel from the second sub pixel may be the second distance B. In another example, in the first pixel 10-1, the distance of the third sub pixel from the second sub pixel may be the first distance A, and in the second pixel 10-2, the distance of the third sub pixel from the second sub pixel may be the second distance B.

The distance between the second sub pixels included in each of the plurality of pixels which are disposed adjacently in the vertical direction in the matrix format according to an embodiment may be the same. Here, the distance between the second sub pixels may be referred to as a pixel pitch or a dot pitch, but will be collectively referred to as the pixel pitch below.

For example, the pixel pitch may be 0.51 mm. In this case, the distance between the second sub pixel included in the first pixel 10-1 and the second sub pixel included in the second pixel 10-2 which is dispose adjacently in the vertical direction with the first pixel 10-1 may be 0.51 mm. Meanwhile, the specific pixel pitch is merely one example, and the pixel pitch may be variously modified according to a manufacturing process, a size of a device, an object of manufacture, and the like such as, for example, and without limitation, 1.0 mm, 0.5 mm, and the like.

The distance between the second sub pixels which are included in each of the two pixels that are disposed adjacently in the vertical direction from among the plurality of pixels may be constant. On the other hand, because the distance of the first sub pixel from the second sub pixel or the distance of the third sub pixel from the second sub pixel is not be fixed, and can be fluidly changed, the distance between the first sub pixels or the distance between the third sub pixels which are included in each of the two pixels that are disposed adjacently in the vertical direction from among the plurality of pixels may not be constant.

In the manufacturing process of the display module 110, the second sub pixel included in each of the plurality of pixels may be formed at a fixed position, but the first and third sub pixels may be formed at fluid positions. However, as shown in FIG. 7 and FIG. 8, the first to third sub pixels included in the pixel positioned at a specific area, for example, both edge areas or the four vertex areas within the display module 110, or the like, may be formed at a fixed position. Here, the fixed position may mean a position which is disposed spaced apart from the second sub pixel by a first interval A.

Figure 11:
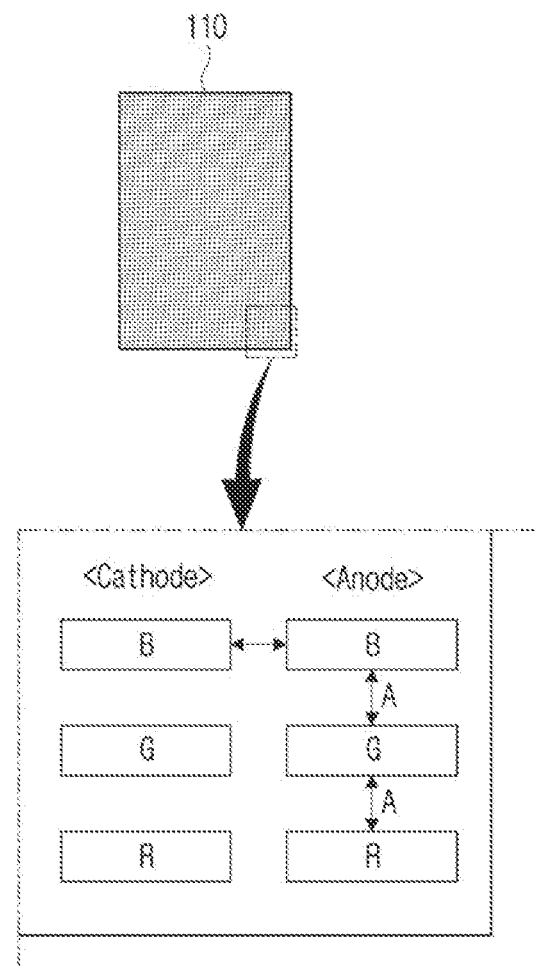
FIG. 11 is a diagram illustrating a cathode and an anode according to an embodiment of the disclosure.

FIG. 11 is a diagram illustrating a cathode and an anode according to an embodiment of the disclosure. Referring to FIG. 11, the display module 110 according to an embodiment may be implemented with a printed circuit board (PCB) substrate, and an LED pad to bond a sub pixel LED may be formed on the PCB substrate. Here, the LED pad may include a cathode and an anode.

In an example, the LED pad may include a first anode corresponding to the first sub pixel forming the first pixel 10-1 and a first cathode which is disposed in a line in the horizontal direction with the first anode, a second anode corresponding to the second sub pixel forming the first pixel 10-1 and a second cathode which is disposed in a line in the horizontal direction with the second anode, and a third anode corresponding to the third sub pixel forming the first pixel 10-1 and a third cathode which is disposed in a line in the horizontal direction with the third anode. Here, each of the second anode and the second cathode may be disposed spaced apart from each of the first anode and the first cathode by the first distance A, and each of the third anode and the third cathode may be disposed spaced apart from each of the second anode and the second cathode by the first distance A.

Here, the first pixel 10-1 may correspond to the pixel positioned at the both edge areas as shown in FIG. 7 or the pixel positioned at the four vertex areas as shown in FIG. 8. The first distance may be 90 μm, and the distance spaced apart between the cathode and the anode may be 75 μm.

However, this is one example, and may be variously changed according to a size of the sub pixel LED device, the degree of accumulation, a size of the PCB substrate, and the like.

In addition, the LED pad may include a first anode corresponding to the first sub pixel forming the second pixel 10-2 and a first cathode which is disposed in a line in the horizontal direction with the first anode, a second anode corresponding to the second sub pixel which is included in the remaining at least one pixel and a second cathode which is disposed in a line in the horizontal direction with the second anode, and a third anode corresponding to the third sub pixel which is included in the remaining at least one pixel and a third cathode which is disposed in a line in the horizontal direction with the third anode, and each of the second anode and the second cathode may be disposed spaced apart from each of the first anode and the first cathode by the second distance, and each of the third anode and the third cathode may be disposed spaced apart from each of the second anode and the second cathode by the third distance. Here, the second pixel 10-2 may be a pixel which is disposed adjacently in the vertical direction with the first pixel 10-1. The second distance B and the third distance C may be a distance which is relatively farther than the first distance. In addition, second distance B and the third distance C may be the same distance or different distances.

Further, the display module 110 may be manufactured such that a first sub pixel LED device is in contact with the first cathode and the first anode, a second sub pixel LED device is in contact with the second cathode and the second anode, and a third sub pixel LED device is in contact with the third cathode and the third anode.

The second sub pixel according to an embodiment may be the green (G) sub pixel, the first sub pixel may be any one from among the red (R) sub pixel or the blue (B) sub pixel, and the third sub pixel may be the remaining one from among the red (R) sub pixel or the blue (B) sub pixel. Referring to FIG. 10, the sub pixels included in the pixel may be disposed in the order of the R sub pixel, the G sub pixel and the B sub pixel. In another example, the sub pixels included in the pixel may be disposed in the order of the B sub pixel, the G sub pixel, and the R sub pixel. In this case, the pixel pitch may be determined based on a distance between the G sub pixels which are adjacent in the vertical direction. The distance between the sub pixels which are adjacent in the horizontal direction may be constant. In another example, the distance between the sub pixels adjacent in the horizontal direction may be fluidly changed within a certain range. FIG. 11 is shown assuming the second sub pixel as the G sub pixel for convenience of description, but is not limited thereto. For example, the second sub pixel may be any one from among the R sub pixel or the B sub pixel.

Figure 12:
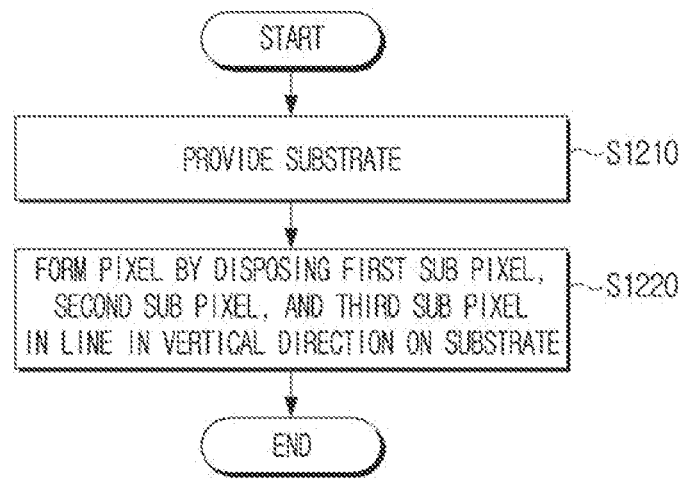
FIG. 12 is a flowchart illustrating a manufacturing method of a display device according to an embodiment of the disclosure.

FIG. 12 is a flowchart illustrating a manufacturing method of a display device according to an embodiment of the disclosure.

First, a substrate is provided (S1210). Then, a pixel is formed by disposing the first sub pixel, the second sub pixel, and the third sub pixel in a line in the vertical direction on the substrate (S1220). Here, the step S1220 of forming the pixel may include forming at least one pixel which includes the first sub pixel, the second sub pixel which is disposed spaced apart from the first sub pixel by the first distance, and the third sub pixel which is disposed spaced apart from the second sub pixel by the first distance, and forming a remaining at least one pixel which includes the first sub pixel, the second sub pixel which is disposed spaced apart from the first sub pixel by the second distance which is different from the first distance, and the third sub pixel which is disposed spaced apart from the second sub pixel by the third distance. Here, the second distance and the third distance may be same or different.

In addition, a method for manufacturing according to an embodiment may further include forming a plurality of pixels on a substrate in matrix format, and the step S1220 of forming the plurality of pixels may include disposing at least one pixel at both edge areas facing each other within the substrate from among the plurality of pixels, and disposing the remaining at least one pixel at the remaining area excluding the both edge areas within the substrate. Here, the both edge areas within the substrate may include an upper edge area and a lower edge area of the substrate.

The first distance according to an embodiment may be a distance which is relatively shorter than the second distance and the third distance.

The method for manufacturing according to an embodiment may further include forming the plurality of pixels on the substrate in the matrix format, and the step S1220 of forming the plurality of pixels may include disposing at least one pixel to four vertex areas of the substrate, and disposing the remaining at least one pixel to the remaining area on the substrate excluding the four vertex areas.

The method for manufacturing according to an embodiment may further include forming the plurality of pixels on the substrate in the matrix format, and the step S1220 of forming the plurality of pixels may include disposing the distance between the second sub pixels included in each of the plurality of pixels which are disposed adjacently in the vertical direction in the matrix format to be spaced apart the same.

The second sub pixel according to an embodiment may be the green (G) sub pixel, the first sub pixel may be any one from among the red (R) sub pixel or the blue (B) sub pixel, and the third sub pixel may be the remaining one from among the red (R) sub pixel or the blue (B) sub pixel.

The various embodiments of the disclosure may not only be applicable to a display device, but also to electronic devices of all types that include a display. The various embodiments described above may be implemented in a recordable medium which is readable by a computer or a device similar to the computer using software, hardware, or the combination of software and hardware. In some cases, embodiments described herein may be implemented by the processor itself. According to a software implementation, embodiments such as the procedures and functions described herein may be implemented with separate software modules. Each of the software modules may perform one or more functions and operations described herein.

Computer instructions for performing processing operations of a display device 100 according to the various embodiments described above may be stored in a non-transitory computer-readable medium. The computer instructions stored in this non-transitory computer-readable medium may cause a specific device to perform the processing operations in the display device 100 according to the above-described various embodiments when executed by a processor of the specific device.

The non-transitory computer readable medium may refer to a medium that stores data semi-permanently rather than storing data for a very short time, such as a register, a cache, a memory, or the like, and is readable by a device. Specific examples of the non-transitory computer readable medium may include, for example, and without limitation, a compact disc (CD), a digital versatile disc (DVD), a hard disc, a Blu-ray disc, a universal serial bus (USB), a memory card, a read only memory (ROM), and the like.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display device comprising: a plurality of display modules; and
one or more processors configured to control the plurality of display modules to display an image, wherein: each of the plurality of display modules comprises a plurality of pixels, each of the plurality of pixels comprises a first sub pixel, a second sub pixel, and a third sub pixel which are disposed in a vertical direction, a first pixel of the plurality of pixels comprises: a first sub pixel of the first pixel, a second sub pixel of the first pixel, which is disposed to be spaced apart from the first sub pixel of the first pixel by a first distance, and a third sub pixel of the first pixel, which is disposed to be spaced apart from the second sub pixel of the first pixel by the first distance, and a second pixel of the plurality of pixels comprises: a first sub pixel of the second pixel, a second sub pixel of the second pixel, which is disposed to be spaced apart from the first sub pixel of the second pixel by a second distance that is different from the first distance, and a third sub pixel of the second pixel, which is disposed to be spaced apart from the second sub pixel of the second pixel by a third distance, wherein the plurality of pixels is arrayed in a matrix format and the plurality of pixels further comprises a third pixel and a fourth pixel, wherein each of the first pixel and the third pixel corresponds to at least two pixels respectively positioned at both edge areas within a display module in the plurality of display modules, wherein each of the second pixel and the fourth pixel corresponds to a pixel positioned at a remaining area outside of the both edge areas within the display module in the plurality of display modules, wherein the both edge areas within the display module comprise an upper edge area of the display module and a lower edge area of the display module, wherein the third pixel is disposed to be adjacent to the first pixel in a horizontal direction in the matrix format, wherein the fourth pixel is disposed to be adjacent to the second pixel in the horizontal direction in the matrix format, and wherein a distance between the second sub pixel of the first pixel and the second sub pixel of the second pixel, and a distance between a second sub pixel of the third pixel and a second subpixel of the fourth pixel are same, wherein a distance between the first sub pixel of the first pixel and the first sub pixel of the second pixel, and a distance between a first sub pixel of the third pixel and a first subpixel of the fourth pixel are different, and wherein a distance between the third sub pixel of the first pixel and the third sub pixel of the second pixel, and a distance between a third sub pixel of the third pixel and a third subpixel of the fourth pixel are different.

2. The display device of claim 1, wherein the second distance and the third distance are same or different.

3. The display device of claim 1, wherein the first distance is shorter than the second distance or the third distance.

4. The display device of claim 1, wherein the plurality of pixels is arrayed in a matrix format,
wherein the first pixel corresponds to one of pixels positioned at four vertex areas within the display module, and
the second pixel corresponds to a pixel positioned at a remaining area outside of the four vertex areas within the display module.

5. The display device of claim 1, wherein:
the second sub pixel of the first pixel or the second sub pixel of the second pixel is a green (G) sub pixel,
the first sub pixel of the first pixel or the first sub pixel of the second pixel is a red (R) sub pixel or a blue (B) sub pixel, and
the third sub pixel of the first pixel or the third sub pixel of the second pixel is the red (R) sub pixel or the blue (B) sub pixel.

6. The display device of claim 1, wherein each of the plurality of display modules comprises a printed circuit board (PCB) substrate, and
the PCB substrate comprises:
a first anode corresponding to the first sub pixel of the first pixel and a first cathode disposed in a horizontal direction with the first anode;
a second anode corresponding to the second sub pixel of the first pixel and a second cathode disposed in the horizontal direction with the second anode; and
a third anode corresponding to the third sub pixel of the first pixel and a third cathode disposed in the horizontal direction with the third anode,
wherein:
each of the second anode and the second cathode are disposed to be spaced apart from each of the first anode and the first cathode by the first distance, and
each of the third anode and the third cathode are disposed to be spaced apart from each of the second anode and the second cathode by the first distance.

7. A display device comprising: a plurality of pixels, wherein: each of the plurality of pixels comprises a first sub pixel, a second sub pixel, and a third sub pixel that are disposed in a vertical direction, a first pixel of the plurality of pixels comprises: a first sub pixel of the first pixel, a second sub pixel of the first pixel, which is disposed to be spaced apart from the first sub pixel of the first pixel by a first distance, and a third sub pixel of the first pixel, which is disposed to be spaced apart from the second sub pixel by the first distance, and a second pixel of the plurality of pixels comprises: a first sub pixel of the second pixel, a second sub pixel of the second pixel, which is disposed to be spaced apart from the first sub pixel by a second distance that is different from the first distance, and a third sub pixel of the second pixel, which is disposed to be spaced apart from the second sub pixel by a third distance, wherein the plurality of pixels is arrayed in a matrix format and the plurality of pixels further comprises a third pixel and a fourth pixel, wherein each of the first pixel and the third pixel corresponds to at least two pixels respectively positioned at both edge areas within a display module in the plurality of display modules, wherein each of the second pixel and the fourth pixel corresponds to a pixel positioned at a remaining area outside of the both edge areas within the display module in the plurality of display modules, wherein the both edge areas within the display module comprise an upper edge area of the display module and a lower edge area of the display module, wherein the third pixel is disposed to be adjacent to the first pixel in a horizontal direction in the matrix format, wherein the fourth pixel is disposed to be adjacent to the second pixel in the horizontal direction in the matrix format, and wherein a distance between the second sub pixel of the first pixel and the second sub pixel of the second pixel, and a distance between a second sub pixel of the third pixel and a second subpixel of the fourth pixel are same, wherein a distance between the first sub pixel of the first pixel and the first sub pixel of the second pixel, and a distance between a first sub pixel of the third pixel and a first subpixel of the fourth pixel are different, and wherein a distance between the third sub pixel of the first pixel and the third sub pixel of the second pixel, and a distance between a third sub pixel of the third pixel and a third subpixel of the fourth pixel are different.

8. A method for manufacturing a display device, comprising: providing a substrate; and forming a pixel by disposing a first sub pixel, a second sub pixel, and a third sub pixel in a vertical direction on the substrate, wherein: the forming the pixel comprises: forming at least one pixel that includes a first sub pixel of the first pixel, a second sub pixel of the first pixel, which is disposed spaced apart from the first sub pixel by a first distance, and a third sub pixel of the first pixel, which is disposed spaced apart from the second sub pixel by the first distance, and forming a second pixel that includes a first sub pixel of the second pixel, a second sub pixel of the second pixel, which is disposed to be spaced apart from the first sub pixel by a second distance that is different from the first distance, and a third sub pixel of the second pixel, which is disposed spaced apart from the second sub pixel by a third distance, wherein the plurality of pixels is arrayed in a matrix format and the plurality of pixels further comprises a third pixel and a fourth pixel, wherein each of the first pixel and the third pixel corresponds to at least two pixels respectively positioned at both edge areas within a display module in the plurality of display modules, wherein each of the second pixel and the fourth pixel corresponds to a pixel positioned at a remaining area outside of the both edge areas within the display module in the plurality of display modules, wherein the both edge areas within the display module comprise an upper edge area of the display module and a lower edge area of the display module, wherein the third pixel is disposed to be adjacent to the first pixel in a horizontal direction in the matrix format, wherein the fourth pixel is disposed to be adjacent to the second pixel in the horizontal direction in the matrix format, wherein a distance between the second sub pixel of the first pixel and the second sub pixel of the second pixel, and a distance between a second sub pixel of the third pixel and a second subpixel of the fourth pixel are same, wherein a distance between the first sub pixel of the first pixel and the first sub pixel of the second pixel, and a distance between a first sub pixel of the third pixel and a first subpixel of the fourth pixel are different, and wherein a distance between the third sub pixel of the first pixel and the third sub pixel of the second pixel, and a distance between a third sub pixel of the third pixel and a third subpixel of the fourth pixel are different.

9. The method of claim 8, wherein the second distance and the third distance are same or different.

10. The method of claim 8, wherein the first distance is shorter than the second distance or the third distance.

11. The method of claim 8,
wherein the first pixel corresponds to one of pixels positioned at four vertex areas within the display device, and the second pixel corresponds to a pixel positioned at a remaining area outside of the four vertex areas within the display device.

12. The method of claim 8, wherein:
the second sub pixel of the first pixel or the second sub pixel of the second pixel is a green (G) sub pixel,
the first sub pixel of the first pixel or the first sub pixel of the second pixel is a red (R) sub pixel or a blue (B) sub pixel, and
the third sub pixel of the first pixel or the third sub pixel of the second pixel is the red (R) sub pixel or the blue (B) sub pixel.

13. The method of claim 8, wherein the display device comprises a printed circuit board (PCB) substrate, and
the PCB substrate comprises:
a first anode corresponding to the first sub pixel of the first pixel and a first cathode disposed in a horizontal direction with the first anode;
a second anode corresponding to the second sub pixel of the first pixel and a second cathode disposed in the horizontal direction with the second anode; and
a third anode corresponding to the third sub pixel of the first pixel and a third cathode disposed in the horizontal direction with the third anode,
wherein:
each of the second anode and the second cathode are disposed to be spaced apart from each of the first anode and the first cathode by the first distance, and
each of the third anode and the third cathode are disposed to be spaced apart from each of the second anode and the second cathode by the first distance.

* * * * *